United States Patent [19]

Fellrath

[11] 4,096,444

[45] Jun. 20, 1978

[54] ACTIVE INTEGRATED CIRCUIT

[75] Inventor: Jean Fellrath, Neuchatel, Switzerland

[73] Assignee: Centre Electronique Horloger S.A., Neuchatel, Switzerland

[21] Appl. No.: 712,876

[22] Filed: Aug. 9, 1976

[30] Foreign Application Priority Data

Aug. 12, 1975 Switzerland .................. 10456/75

[51] Int. Cl.² .......................... H03F 3/16; H03B 5/36; H03B 5/20
[52] U.S. Cl. ................................. 330/277; 330/288; 330/293; 330/296; 331/108 B; 331/116 R
[58] Field of Search ................ 330/22, 40, 28, 35; 331/108 B, 116 R

[56] References Cited

U.S. PATENT DOCUMENTS 3,700,981  10/1972  Masuhara et al. ............ 330/35 X
3,868,597  2/1975   Gollinger .................... 331/116 R
3,889,211  6/1975   Morozumi .................... 331/116 R Primary Examiner—James B. Mullins
Attorney, Agent, or Firm—Cushman, Darby & Cushman

[57] ABSTRACT

An active circuit is disclosed including an integrated circuit having at least one amplification stage comprising an FET. At least one negative feedback transistor is provided of the same conduction type as the amplifying transistor, with the drain-to-source path of the negative feedback transistor coupled in series between the drain and gate of the amplifying transistor. At least one biasing transistor of the same conduction type as the amplifying transistor are provided to bias the gate of the negative feedback transistor. The drain of the at least one biasing transistor is connected to a current source furnishing a current having a given ratio to the power supply current of the amplifying transistor. This circuit permits precise control of the small-signal resistance of the feedback transistor.

14 Claims, 10 Drawing Figures

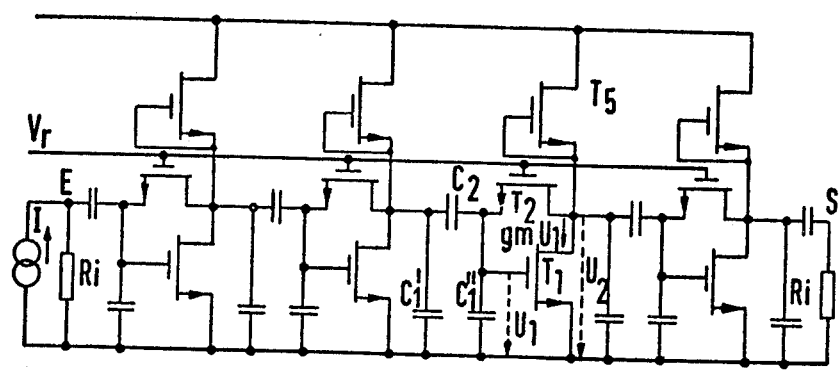
FIG. 9
FIG. 10
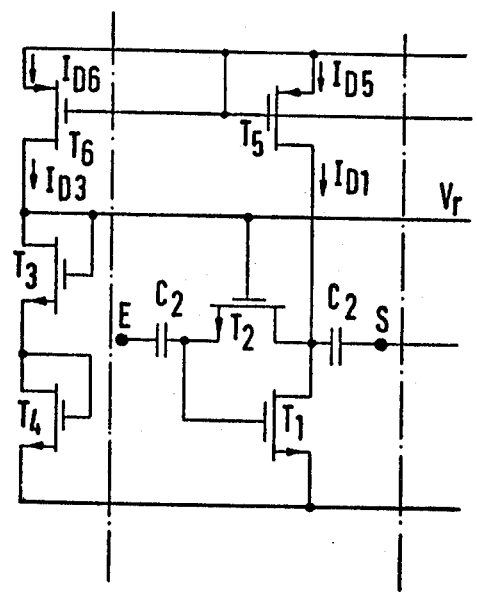

ACTIVE INTEGRATED CIRCUIT

BACKGROUND OF THE INVENTION

This invention concerns an active circuit composed of insulated gate field effect transistors (FET), integrated within the same substrate, containing at least one amplification stage that includes a transistor amplifier whose source constitutes the junction of the input and output circuits of the amplifier stage, these circuits being capacitively coupled with the gate and the drain of the transistor amplifier, the drain of this transistor being connected to a current source that furnishes a current $I_{D1}$.

The known integrable active circuits employing negative feedback in an amplifier stage, e.g., by using a resistor made of slightly doped polycrystalline silicon (Swiss patent application number 11788/74) or a band pass gate (U.S. Pat. No. 3,753,154) present the serious drawback of not permitting precise control of the amplifier characteristics. In particular, gain, power consumption, input and output resistance and frequency limits vary from one series of circuits to another and even from one stage to another. The circuit characteristics are poorly defined and the manufacturing output is affected adversely.

OBJECTS AND SUMMARY OF THE INVENTION

The objective of this invention is to remove these drawbacks.

For this purpose, the circuit of this invention is characterized by the fact that the amplifier stage includes one or more negative feedback transistors of the same conduction type as the amplifying transistor whose drain-to-collector paths are coupled in series between the drain and the gate of the amplifying transistor and whose gate or gates are biased by a biasing circuit consisting of two biasing transistors of the same conduction type as the amplifying transistor, the first one having its source at the same potential as that of the amplifying transistor and its gate at the same average potential as its drain, and the second one having its source connected to the drain of the first one and having its gate and drain connected to each other and to the gate or gates of the negative feedback transistor or transistors, the drain of the second biasing transistor being connected to a source of current furnishing a current $I_{D3}$ having a given ratio to the power supply current $I_{D1}$ of the amplifying transistor.

This circuit, which takes advantage of the similarity of insulated gate field effect transistors (FET) that are integrated in the same substrate, permits precisely controlling the small-signal resistance of the feedback transistor, which is operating near the origin of the characteristic curve, and thus determining the negative feedback factor and therefore the gain, input and output resistance and the limiting frequencies of the amplifier stage.

The active circuit may be designed as an amplifier with one or more stages or as an oscillator.

In one design, at least the transistors of the amplifier stage and of the biasing circuit are biased in the weak inversion mode which corresponds to a low current density and to a bias voltage between gate and source whose absolute value is smaller than the threshold voltage usually defined in the strong inversion mode, since the equation relating the drain current to the gate voltage is exponential. This permits obtaining a ratio of gain to current consumption that is particularly favorable. Nevertheless, the circuit may also operate in the strong inversion mode for which the conductance of the drain is a linear function of the gate voltage. The attached drawings illustrate several embodiments of the active circuit in accordance with the invention.

BRIEF DESCRIPTION OF THE DRAWINGS

FIG. 9 is a schematic diagram similar to that of FIG. 4 of a series of amplifier stages but in which the current supply transistors are depletion transistors of the same conductivity type as the amplifying transistors.

FIG. 10 is a schematic diagram of an active circuit similar to that of FIG. 3 but in which the current supply comprises depletion transistors of a conductivity opposite that of the amplifying transistor.

Figure 1:
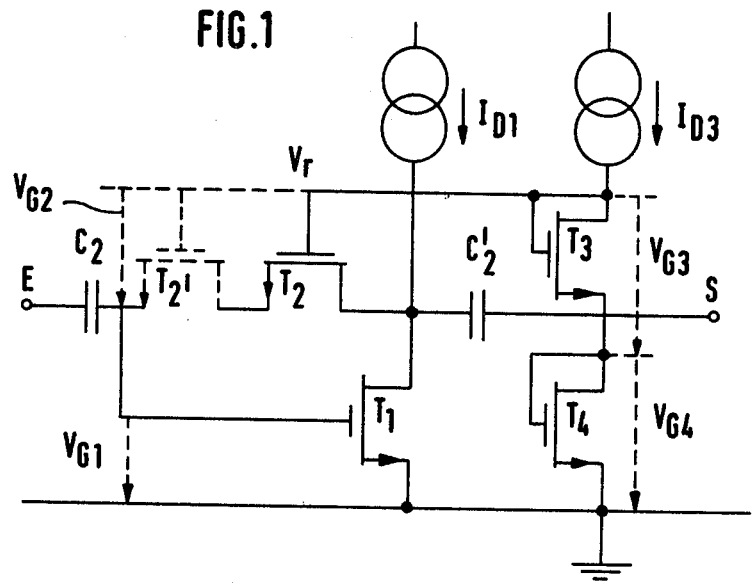
FIG. 1 is a basic schematic diagram of an amplifier stage with a biasing circuit in accordance with the invention.

In the schematic diagram shown in FIG. 1, the transistors $T_1$ through $T_4$ are insulated gate field effect transistors (FET) integrated on a single chip of silicon and are all of the same type, for instance, type $n$. $T_1$ designates an amplifying transistor which, together with the negative feedback transistor, constitutes the amplifier stage. The source of $T_1$ is the common point for the input and output circuits of this stage, the input terminal E and the output terminal S being connected by capacitors $C_2$ and $C_2'$ to the gate and drain of $T_1$. Furthermore, the drain of $T_1$ is connected to a current source that furnishes a current $I_{D1}$ as well as to the drain of the negative feedback transistor $T_2$ whose source is connected to the gate of $T_1$.

Two or more negative feedback transistors may be connected between the drain and the gate of $T_1$, their drain-to-gate paths being wired in series between these electrodes as is shown in FIG. 1 for two transistors $T_2$ and $T_2'$, the latter being indicated in dashed lines. The gates of the negative feedback transistors are biased by means of a biasing circuit that consists of $T_3$ and $T_4$, furnishing a bias voltage $V_r$ to the drain of $T_3$. The drain of $T_3$ is connected to its gate. The drain of $T_4$ is similarly connected to its own gate. The common gate-drain junction of $T_4$ is also connected to the source $T_3$. The source of biasing transistor $T_4$ is joined to that of amplifying transistor $T_1$ and, in this case, to ground as well. A current source furnishing current $I_{D3}$ is connected to the gate of biasing transistor $T_3$.

The transistor $T_2$ (possibly $T_2'$), which is biased by $V_r$, does not have any gate current and operates at zero voltage between drain and source. It is known that, when working with small signals, a transistor that operates near the origin of the drain-to-source voltage/drain current characteristic curve behaves as a resistance whose value depends on the voltage that is applied between the gate and the source. It was demonstrated by M. B. Barron ("Low level currents in IGFET", Solid State Electronics 1972, Vol. 15, pages 293 to 302) and by R. M. Swanson and J. D. Meindl ("Ion-implanted CMOS transistors in low voltage circuits," IEEE Journal of Solid State Circuits, Vol. SC7 No. 3, April 1972), for example, that a MOST (metal-oxide-semiconductor transistor), operating at a gate-to-source voltage lower than the threshold voltage, satisfies the following equation:

$$I_D = \frac{W}{L} I_{Do} e^{\frac{V_G}{nV_{th}}} (1 - e^{-\frac{V_D}{V_{th}}}) \quad \text{where} \tag{1}$$

$I_D$ = drain current
$W$ = width of transistor channel
$L$ = length of transistor channel
$I_{Do}$ = characteristic current (technological constant)
$V_G$ = gate-to-source voltage
$V_D$ = drain-to-source voltage
$n$ = characteristic exponent (technological constant)
$V_{th} = kT/q$
$K$ = Boltzmann's constant
$q$ = electron charge
$T$ = absolute temperature It follows that the output conductance of this transistor for a constant value of $V_G$ is equal to:

$$g_o = \frac{dI_D}{dV_D}\bigg|_{V_G = \text{const.}} = \frac{W}{L} \cdot \frac{I_{Do}}{V_{th}} \cdot e^{\frac{V_G}{nV_{th}}} \cdot e^{-\frac{V_D}{V_{th}}} \tag{2}$$

In particular, near the origin of the characteristic curve, where $V_D = o$, the output conductance becomes:

$$g_{oo} = \frac{W}{L} \cdot \frac{I_{Do}}{V_{th}} \cdot e^{\frac{V_G}{nV_{th}}} \tag{3}$$

Referring to the diagram in FIG. 1, assuming that all of the transistors operate in the weak inversion mode, (which corresponds to a low current density and to a gate-to-source bias voltage that is lower in absolute value than the threshold voltage usually defined for the strong inversion mode), using the values corresponding to the particular transistors concerned, and assuming that the technological constants $I_{Do}$ and $n$ will be the same for all of the transistors, we can then write the following equations:

$$I_{D1} = \frac{W_1}{L_1} \times I_{Do} \times e^{\frac{V_{G1}}{nV_{th}}} \tag{4}$$

$$I_{D3} = \frac{W_3}{L_3} \times I_{Do} \times e^{\frac{V_{G3}}{nV_{th}}} = \frac{W_4}{L_4} I_{Do} e^{\frac{V_{G4}}{nV_{th}}} \tag{5}$$

Rearranging the above equations, we obtain the following:

$$V_{G1} = -nV_{th} \times \ln \frac{I_{Do}}{I_{D1}} \times \frac{W_1}{L_1} \tag{6}$$

$$V_{G3} = -nV_{th} \times \ln \frac{I_{Do}}{I_{D3}} \times \frac{W_3}{L_3} \tag{7}$$

$$V_{G4} = -nV_{th} \times \ln \frac{I_{Do}}{I_{D3}} \times \frac{W_4}{L_4} \tag{8}$$

and, by rearranging equation (3), we get the following equation for $V_{G2}$:

$$V_{G2} = -nV_{th} \times \ln \frac{I_{Do}}{g_{200} V_{th}} \times \frac{W_2}{L_2} \tag{9}$$

where $g_{200}$ represents the output conductance of $T_2$ near the origin.

According to the schematic diagram given in FIG. 1:

$$V_{G1} + V_{G2} = V_{G3} + V_{G4} \tag{10}$$

or $$-V_{G1} - V_{G2} + V_{G3} + V_{G4} = 0 \tag{11}$$

which results in the following:

$$nV_{th} \times \ln \frac{I_{D1}}{I_{Do} \frac{W_1}{L_1}} \times \frac{g_{200} \times V_{th}}{I_{Do} \times \frac{W_2}{L_2}} \times \frac{I_{Do} \times \frac{W_3}{L_3}}{I_{D3}} \times \frac{I_{Do} \times \frac{W_4}{L_4}}{I_{D3}} = 0 \tag{12}$$

where $$g_{200} = \frac{I^2_{D3}}{I_{D1}} \times \frac{1}{V_{th}} \times \frac{\frac{W_1}{L_1}}{\frac{W_3}{L_3}} \times \frac{\frac{W_2}{L_2}}{\frac{W_4}{L_4}} \tag{13}$$

If current $I_{D1}$ is related to current $I_{D3}$ by the following equation $$I_{D1} = \alpha I_{D3} \tag{14}$$

the small-signal resistance equivalent to $T_2$ for small signals becomes:

$$R = \frac{1}{g_{200}} = \frac{V_{th}}{I_{D3}} \times \frac{\frac{W_3}{L_3}}{\frac{W_1}{L_1}} \times \frac{\frac{W_4}{L_4}}{\frac{W_2}{L_2}} \times \alpha \tag{15}$$

and therefore depends only on physical constants, dimensional ratios of transistors and, for a given value of $\alpha$, on the value of $I_{D3}$.

By using appropriate dimensional ratios, it is possible to obtain values of resistance R greater than 30 megohms.

Figure 2:
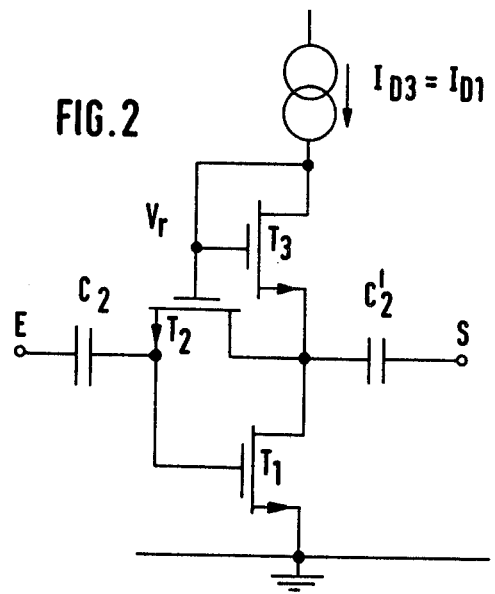
FIG. 2 is a simplified schematic diagram in which the amplifying transistor operates simultaneously as a biasing transistor.

FIG. 2 shows a variation of FIG. 1 in which transistor $T_1$ simultaneously plays the role of transistor $T_4$ in FIG. 1. In fact, by choosing α to be equal to 1 and by using the schematic circuit diagram of FIG. 1 for geometrically and electrically similar transistors $T_1$ and $T_4$, the $T_1$ and $T_4$ drain voltages become equal and the $T_3$ and $T_4$ drain currents are also equal. Therefore, in this case, we can use the circuit shown in FIG. 2 to perform the same function since the voltage applied to the gate of $T_2$ will remain unchanged.

It should be noted that this connection of transistor $T_3$ introduces additional capacitance to ground into the amplifier stage, which can be annoying for certain applications. Furthermore, for low supply voltages, the presence of $T_3$ limits the variation of output voltage possible, which also can be a drawback.

Figure 3:
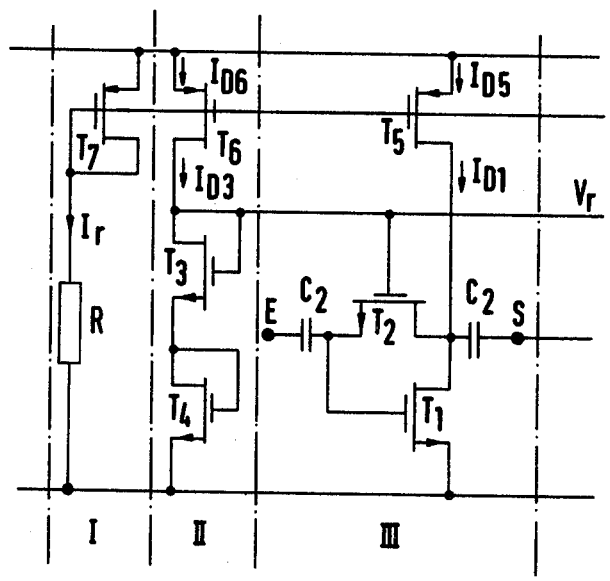
FIG. 3 is a schematic diagram similar to that of FIG. 1 and shows, in greater detail, the current supply for the amplifier stage and the biasing circuit.

FIG. 3 represents an amplifying stage (III) and a biasing circuit (II) with the corresponding sources of current as well as a reference current circuit (I). The circuit for transistors $T_1$ to $T_4$ is the same as that in FIG. 1. Transistors $T_5$ and $T_6$ constitute the current sources for $T_1$ and $T_3$, $T_4$ respectively. Transistors $T_5$ and $T_6$ are of a conduction type opposite to that of transistors $T_1$ and $T_4$ and they are connected by their respective drains to the sources of transistors $T_1$ and $T_3$, the sources of $T_5$ and $T_6$ being connected to one pole of the voltage supply. The gates of transistors $T_5$ and $T_6$ are connected to each other and to the gate of a transistor of the same type, $T_7$ which forms part of the reference current circuit (I). The source of $T_7$ is connected to the same pole of the voltage supply as are $T_5$ and $T_6$. The drain of transistor $T_7$ is joined to the gate of the latter as well as to a current reference component, which is not shown, determining the reference current $I_r$ which passes through $T_7$. Since transistors $T_5$ to $T_7$ are integrated in the same substrate and connected in the manner described above, the currents $I_{D3}$ and $I_{D1}$ are proportional to $I_r$ and to the ratio of the respective geometrical dimensions of transistors $T_7$, $T_6$ and transistors $T_7$, $T_5$.

Transistors $T_1$ to $T_4$ and preferably $T_5$ to $T_7$ as well may operate in a weak inversion mode as defined above.

Due to the fact that $$I_{D3} = I_{D6} = \frac{\frac{W_6}{L_6}}{\frac{W_7}{L_7}} \times I_r$$

$$I_{D1} = I_{D5} = \frac{\frac{W_5}{L_5}}{\frac{W_7}{L_7}} \times I_r \quad (17)$$

and $$\alpha = \frac{I_{D1}}{I_{D3}} = \frac{\frac{W_5}{L_5}}{\frac{W_6}{L_6}} \quad (18)$$

resistance R, which represents transistor $T_2$, may then be expressed by $$R = \frac{V_{th}}{I_r} \times \frac{\frac{W_7}{L_7}}{\frac{W_6}{L_6}} \times \frac{\frac{W_3}{L_3}}{\frac{W_1}{L_1}} \times \frac{\frac{W_4}{L_4}}{\frac{W_2}{L_2}} \times \frac{\frac{W_5}{L_5}}{\frac{W_6}{L_6}} \quad (19)$$

This value may therefore be determined by the dimensional ratios of the transistors employed and by the bias current $I_r$, thus permitting precise control of the negative feedback factor by simply regulating one quantity, namely, the current $I_r$.

This advantage is of particular interest when several amplifier stages are cascaded and have a common biasing circuit (II) and a common reference current circuit (I). The negative feedback resistances of the various stages are then related only by the dimensions of the transistors and may be of the same value.

The reference current $I_r$ of the circuit in FIG. 3 may be furnished, for instance, by a resistor R connected between the common connection of the gate and drain of $T_7$ and the pole of the voltage supply to which the sources of $T_1$ and $T_4$ are connected. In another design of the circuit in FIG. 3, the current reference component consists of a depletion transistor of the same type of conduction as that of transistors $T_1$ to $T_4$. This arrangement furnishes a current supply which is nearly independent of the supply voltage. The depletion transistor employed is obtained by ionic implantation which permits simultaneously shifting its threshold voltage and adjusting it precisely to the value corresponding to the desired current $I_r$.

A variation of the circuit of FIG. 3 consists of eliminating transistor $T_7$ and using depletion transistors of the conduction type opposite to that of transistors $T_1$ to $T_4$ as transistors $T_5$ and $T_6$. This variation is shown in FIG. 10. The gates and the sources of these depletion transistors are connected to one pole of the voltage supply and their drains are connected to transistors $T_1$ and $T_3$ respectively.

Figure 7:
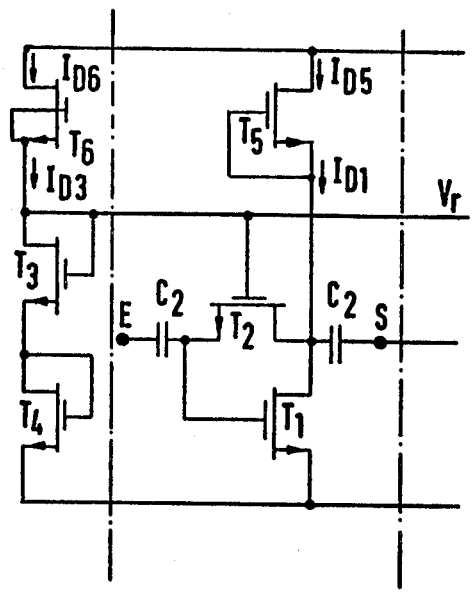
FIG. 7 is a schematic diagram of an active circuit similar to that of FIG. 3 but in which the current supply comprises depletion transistors of the same conductivity type as the amplifying transistors.

Another variation of the circuit of FIG. 3 consists of also eliminating transistor $T_7$ and of using depletion transistors of the conductive type as transistors $T_1$ to $T_4$ in the role of transistors $T_5$ and $T_6$. This variation is shown in FIG. 7. The drains of these transistors $T_5$ and $T_6$ are connected to a pole of the voltage supply. The gate and source of $T_5$ are joined to the $T_1$ drain and the gate and source of $T_6$ are joined to the $T_3$ drain, the circuit of $T_1$ to $T_4$ being the same as shown in FIG. 3. The advantage of this variation is to permit construction of a circuit all of whose transistors are of the same conductive type. This variation is of particular interest for use with the technique of silicon on insulation, since the current sources obtained by this process exhibit a low output conductance and therefore relative independence of the voltage supply.

Figure 4:
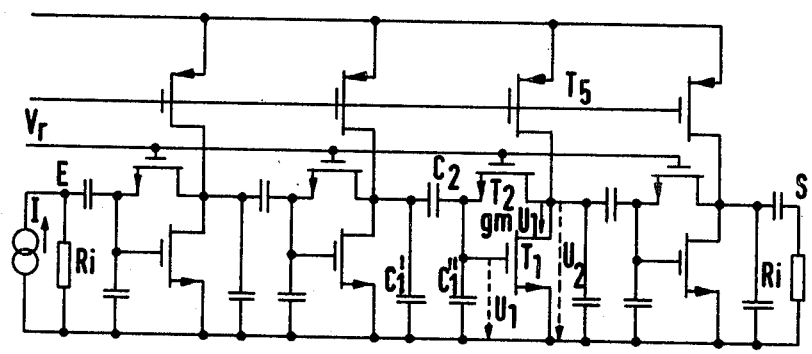
FIG. 4 is a schematic diagram of a series of amplifier stages.

FIG. 4 shows a series of amplifier stages identical to that of FIG. 3, powered and biased in the same manner as the stage in FIG. 3, using the same biasing circuit that furnishes a reference voltage $V_r$ and the same current reference circuit. These circuits are not shown in FIG. 4 but are identical to those of FIG. 3. Similarly, FIG. 9 shows a series of amplifier stages identical to that of FIG. 7, powered and biased in the same manner as the stage in FIG. 7, using the same biasing circuit that furnishes a reference voltage $V_r$ and the same current reference circuit. These circuits are not shown in FIG. 9 but are identical to those of FIG. 7.

Assuming that all of the stages are alike and the series is sufficiently long, we can define the characteristic resistance for medium frequencies by:

$$R_i = (U_1/I) \quad (20)$$

where $U_1$ is the signal voltage at the base of $T_1$ and I is the signal current circulating through the series of stages and, in particular, passing through the drain-to-source path of $T_2$. If $U_2$ is the signal voltage at the output of each stage appearing between the drain and the source of $T_1$ and if $q_m$ is the transconductance of the stage, then we can write:

$$U_2 = R_i(I - g_m U_1). \tag{21}$$

Since the equivalent resistance to $T_2$ is R, we also have:

$$I = (U_1 - U_2)/R \tag{22}$$

From these three equations, we obtain the gain A of a single stage of the series:

$$A = U_2/U_1 = 1 - \sqrt{R \times g_m} \tag{23}$$

and the characteristic resistance $R_i$, which is the input resistance of the series for an infinite number of stages:

$$R_i = \sqrt{(R/g_m)} \tag{24}$$

We introduce the value of R calculated from equation (19) for the circuit of FIG. 3 and determine $g_m$ from general equation (1) [for constant values of $V_D$] as applied to transistor $T_1$, taking into account equation (17).

$$g_m = \frac{dI_{D1}}{dV_G}\bigg|_{V_D = \text{const.}} = \frac{I_{D1}}{nV_{th}} = \frac{I_r}{nV_{th}} \cdot \frac{\frac{W_5}{L_5}}{\frac{W_7}{L_7}} \tag{25}$$

We then obtain the values of A and $R_i$ from equations (26) and (27) respectively:

$$A = 1 - \frac{W_5 L_5}{W_6 L_6} \sqrt{\frac{1}{n} \times \frac{\frac{W_2}{L_2} \times W_1 L_1}{\frac{W_3}{L_3} \times \frac{W_4}{L_4}}} \tag{26}$$

$$R_i = \frac{V_{th}}{I_r} \times \frac{\frac{W_7}{L_7}}{\frac{W_6}{L_6}} \sqrt{n \times \frac{\frac{W_2}{L_2} \times \frac{W_1}{L_1}}{\frac{W_3}{L_3} \times \frac{W_4}{L_4}}} \tag{27}$$

Gain A is therefore independent of $I_r$ and is determined only by geometric parameters and a technological characteristic.

As for $R_i$, it has been established that its value is inversely proportional to $I_r$ and otherwise depends only on dimensional ratios, physical constants and the same technological characteristic $n$.

In order to make an approximate calculation of the limiting frequencies of an amplifier stage of the chain of amplifiers, we assume that A is much greater than 1. If we use $C_1$ to designate the sum of transversal capacitances $C_1'$ and $C_1''$ which appear respectively between the $T_1$ drain and ground and between the $T_1$ gate and ground, and we use $C_2$ to designate the capacitance between the drain of transistor $T_1$ of a stage and the gate of the corresponding transistor of the following stage, we obtain the following equation for the lower limiting frequency:

$$f_{low} = 1/(4\pi C_2 \times R_i) \tag{28}$$

The upper limiting frequency is calculated from the following equation:

$$F_{high} = 1/(\pi C_1 \times R_i) \tag{29}$$

We then deduce, by considering equation (27), that these limiting frequencies are proportional to the reference current $I_r$ and may be controlled by this current if the other parameters are constant.

When the chain of amplifier stages is connected to a common biasing circuit, as in FIG. 4, it may be useful to filter the bias voltage $V_r$ in order to decouple the stages effectively. A relatively high-value capacitor may be connected to ground. This may be a capacitor that is external to the integrated circuit if its value is too large to permit integration. If the transistors that are employed are constructed with a silicon gate, the gates of transistor $T_3$ and transistors $T_2$ of the various stages may be connected by means of polycrystalline silicon which is resistant and presents a distributed capacitance to ground. In this manner, effective filtering is obtained without employing additional components.

Figure 5:
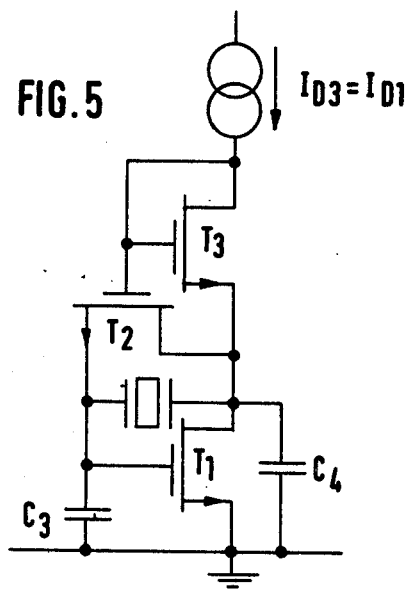
FIG. 5 is a simplified schematic diagram of a quartz oscillator corresponding to the diagram shown in FIG. 2.
Figure 6:
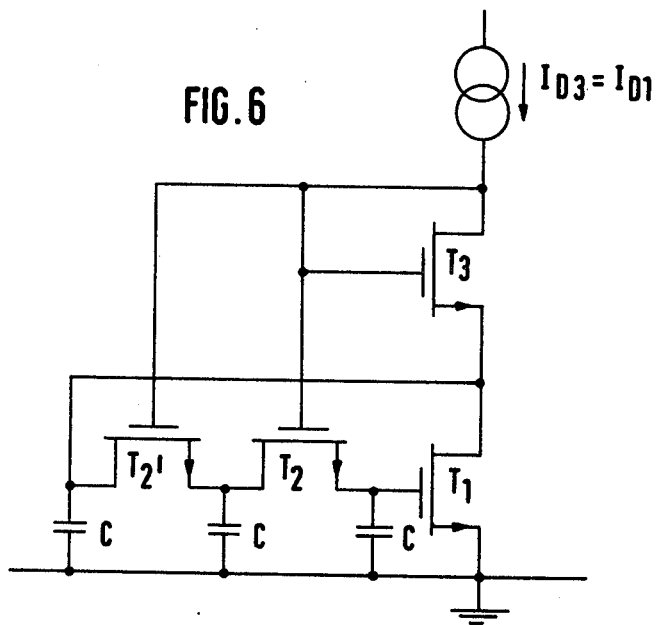
FIG. 6 is a schematic diagram similar to that of FIG. 5 and represents a resistance-capacitance (RC) oscillator.

FIGS. 5 and 6 represent oscillator circuits based on the circuit shown in FIG. 2.

In FIG. 5, a quartz crystal QC is connected between the gate and the drain of transistor $T_1$. Capacitors $C_3$ and $C_4$ are connected between these electrodes and the $T_1$ source. We thus obtain a quartz type Pierce oscillator with the inherent advantages of the present circuit.

FIG. 6 depicts a resistance-capacitance (RC) type oscillator in which two transistors $T_2$ and $T_2'$ constitute the resistances R, their drain-to-source paths being connected in series between the gate and the drain of transistor $T_1$, their gates being connected to the $T_3$ drain. Capacitors C are connected between the sources and drains of transistors $T_2$ and $T_2'$ and the $T_1$ source.

Figure 8:
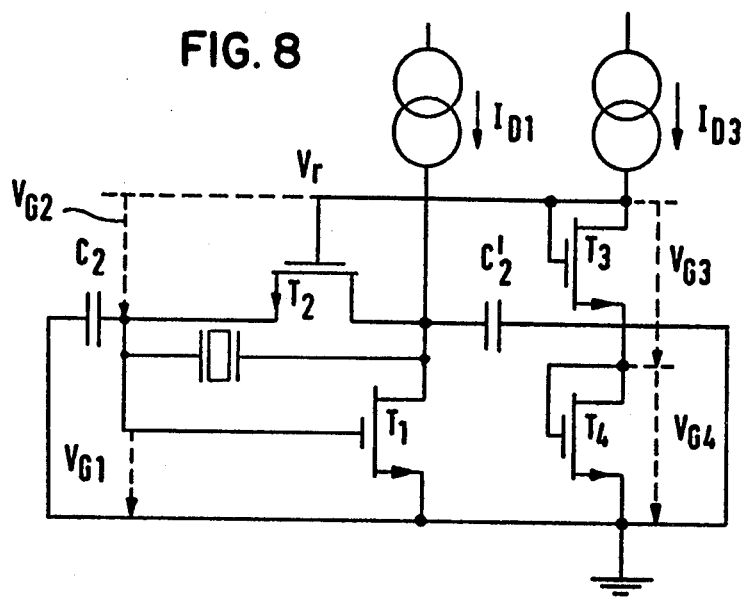
FIG. 8 is a schematic diagram showing a quartz oscillator circuit based on the arrangement of FIG. 1.

Of course, these oscillators can also be constructed by using the basic arrangement shown in FIG. 1. FIG. 8 shows an embodiment of the invention similar to that of FIG. 5, but based on the basic arrangement of FIG. 1.

It follows from the preceding description that this invention provides the possibility of precisely controlling the characteristics of active circuits employing negative feedback simply by using a reference current, the other parameters being only dimensional ratios of transistors, physical constants or technological constants. Thus, this invention offers positive advantages in the manufacture and use of these circuits.

I claim:

1. An active circuit comprising an integrated circuit constructed of insulated gate field effect transistors, and including at least one amplifier stage, input and output circuits for said amplifier stage, said amplifier stage including an amplifying transistor whose source constitutes a common point for the input and output circuits of the amplifier stage, and including capacitors coupling the gate and drain of said amplifying transistor to said input and output circuits, a first current source furnishing a current $I_{D1}$, the drain of said amplifying transistor being connected to said first current source, said amplifier stage including at least one negative feedback transistor of the same conductive type as said amplifying transistor, the drain-to-source path of said feedback transistor placed in series between the drain and gate of said amplifying transistor, a biasing circuit comprising two biasing transistors of the same conductive type as said amplifying transistor, one of said biasing transistors having its source coupled to the same potential as the source of said amplifying transistor and its gate coupled to the same average potential as its drain, the other biasing transistor having its source connected to the drain of said one biasing transistor and its gate and drain connected to each other and to the gate of said at least one negative feedback transistor, a second current source furnishing a current $I_{D3}$ having a given ratio of magnitude to the supply current $I_{D1}$ of said amplifying transistor, and the drain of said other biasing transistor being connected to said second current source.

2. An active circuit in accordance with claim 1 wherein said one biasing transistor and said amplifying transistor have similar characteristics and said first and second current sources furnish equal currents $I_{D1}$ and $I_{D3}$.

3. An active circuit in accordance with claim 1 wherein said amplifier stage and said biasing circuit each are associated with a respective power supply transistor of a conductivity type opposite that of said amplifying transistor, the drains of said power supply transistors being respectively connected to the drains of said amplifying transistor and said other biasing transistor, the gates of said power supply transistors being connected to each other, a power source, the sources of said power supply transistors connected to one pole of said power source, the other pole of said power source connected to the sources of said amplifying transistor and said one biasing transistor.

4. An active circuit in accordance with claim 3 wherein said power supply transistors are depletion transistors having their gates connected to said one pole of said power source.

5. An active circuit in accordance with claim 3 including a current reference circuit comprising an auxiliary transistor of the same conductivity type as said power supply transistors, the source of said auxiliary transistor being connected to said one pole of said power source, the gate of said auxiliary transistor connected to the gates of said power supply transistors and to its own drain, and a reference element for determining the drain current of said auxiliary transistor coupling said drain to said other pole of said power source.

6. An active circuit in accordance with claim 3 wherein a plurality of amplifier stages and a common biasing circuit are provided, the input and output circuits of consecutive amplifier stages being capacitively coupled, the gates of the respective negative feedback transistors all being connected to each other and being biased by said biasing circuit.

7. An active circuit in accordance with claim 1 wherein said amplifier stage and said biasing circuit each are associated with a respective power supply transistor which is a depletion transistor having the same conductivity type as said amplifying transistor, a power source, the drains of said power supply transistors being connected to one pole of said power source, the other pole of said power source being connected to the sources of said amplifying transistor and said one biasing transistor, the respective gates and sources of said power supply transistors being connected to each other and respectively to the drains of said amplifying transistor and said other biasing transistor.

8. An active circuit in accordance with claim 7 wherein a plurality of amplifier stages and a common biasing circuit are provided, the input and output circuits of consecutive amplifier stages being capacitively coupled, the gates of the respective negative feedback transistors all being connected to each other and being biased by said biasing circuit.

9. An active circuit in accordance with claim 1 wherein at least one transistor of said amplifier stage and of said biasing circuit are biased in the weak inversion mode in which the drain current of said transistors varies exponentially as a function of their gate-to-source voltage.

10. An active circuit comprising an integrated circuit constructed of insulated gate field effect transistors, and including at least one amplifier stage, input and output circuits for said amplifier stage, said amplifier stage including an amplifying transistor whose source constitutes a common point for the input and output circuits of the amplifier stage, and including capacitors coupling the gate and drain of said amplifying transistor to said input and output circuits, a current source, said amplifier stage further including at least one negative feedback transistor of the same conductive type as said amplifying transistor, the drain-to-source path of said feedback transistor being placed in series between the drain and gate of said amplifying transistor, a biasing transistor of the same conductive type as said amplifying transistor having its source connected to the drain of said one biasing transistor and its gate and drain connected to each other and to the gate of said at least one negative feedback transistor, the drain of said biasing transistor being connected to said current source.

11. An oscillator circuit comprising an integrated circuit constructed of insulated gate field effect transistors, and including at least one amplifier stage, input and output circuits for said amplifier stage, said amplifier stage including an amplifying transistor whose source constitutes a common point for the input and output circuits of the amplifier stage, the gate and drain of said amplifying transistor being coupled to said input and output circuits, a first current source furnishing a current $I_{D1}$, the drain of said amplifying transistor being connected to said first current source, said amplifier stage including at least one negative feedback transistor of the same conductive type as said amplifying transistor, the drain-to-source path of said feedback transistor being placed in series between the drain and gate of said amplifying transistor, a biasing circuit comprising two biasing transistors of the same conductive type as said amplifying transistor, one of said biasing transistors having its source coupled to the same potential as the source of said amplifying transistor and its gate coupled to the same average potential as its drain, the other biasing transistor having its source connected to the drain of said one biasing transistor and its gate and drain connected to each other and to the gate of said at least one negative feedback transistor, a second current source furnishing a current $I_{D3}$ having a given ratio of magnitude to the supply current $I_{D1}$ of said amplifying transistor, and the drain of said other biasing transistor being connected to said second current source, the circuit further including a quartz crystal connected between the gate and drain of said amplifying transistor, and including capacitors connecting the electrodes of said quartz crystal to the source of said amplifying transistor.

12. An oscillator circuit in accordance with claim 11, wherein said one biasing transistor and said amplifying transistor have similar characteristics and said first and second current sources furnish equal currents $I_{D1}$ and $I_{D3}$.

13. An oscillator circuit comprising an integrated circuit constructed of insulated gate field effect transistors, and including at least one amplifier stage, input and output circuits for said amplifier stage, said amplifier stage including an amplifying transistor whose source constitutes a common point for the input and output circuits of the amplifier stage, the gate and drain of said amplifying transistor being coupled to said input and output circuits, a current source, said amplifier stage further including at least one negative feedback transistor of the same conductive type as said amplifying transistor, the drain-to-source path of said feedback transistor being placed in series between the drain and gate of said amplifying transistor, a biasing transistor of the same conductive type as said amplifying transistor having its sources connected to the drain of said one biasing transistor and its gate and drain connected to each other and to the gate of said at least one negative feedback transistor, the drain of said biasing transistor being connected to said current source, the circuit further including a quartz crystal connected between the gate and drain of said amplifying transistor, and including capacitors connecting the electrodes of said quartz crystal to the source of said amplifying transistor.

14. An oscillator circuit comprising an integrated circuit constructed of insulated gate field effect transistors, and including at least one amplifier stage, input and output circuits for said amplifier stage, said amplifier stage including an amplifying transistor whose source constitutes a common point for the input and output circuits of the amplifier stage, the gate and drain of said amplifying transistor being coupled to said input and output circuits, a current source, said amplifier stage further including two negative feedback transistors of the same conductive type as said amplifying transistor, the drain-to-source paths of said feedback transistors being placed in series with each other and between the drain and gate of said amplifying transistor, a biasing transistor of the same conductive type as said amplifying transistor having its source connected to the drain of said one biasing transistor and its gate and drain connected to each other and to the gates of said two negative feedback transistors, the drain of said biasing transistor being connected to said current source, the circuit further including capacitors connecting the sources and drains of said negative feedback transistors to the source of said amplifying transistor.

* * * * *